United States Patent
Peshkovsky et al.

(10) Patent No.: US 6,980,847 B2
(45) Date of Patent: Dec. 27, 2005

(54) APPARATUS FOR DYNAMIC ANGULAR POSITION TRACKING

(75) Inventors: Alexey Peshkovsky, New York, NY (US); Joseph A. Helpern, Cornwall, NY (US)

(73) Assignee: New York State Department of Mental Hygiene Office of Mental Health, Albany, NY (US)

( * ) Notice: Subject to any disclaimer, the term of this patent is extended or adjusted under 35 U.S.C. 154(b) by 425 days.

(21) Appl. No.: 10/105,604

(22) Filed: Mar. 25, 2002

(65) Prior Publication Data

US 2003/0178995 A1 Sep. 25, 2003

(51) Int. Cl.[7] ............................................... A61B 5/055
(52) U.S. Cl. ...................... 600/414; 600/421; 324/309; 324/308
(58) Field of Search ................................ 600/410, 414, 600/416, 421, 422; 324/307–309, 310, 312, 317, 300

(56) References Cited

U.S. PATENT DOCUMENTS

| | | | |
|---|---|---|---|
| 3,715,654 A | * | 2/1973 | Scarzello .................... 324/301 |
| 5,271,400 A | * | 12/1993 | Dumoulin et al. .......... 600/410 |
| 5,705,014 A | * | 1/1998 | Schenk et al. ............ 156/272.4 |
| 5,880,661 A | * | 3/1999 | Davidson et al. ........... 335/306 |
| 5,947,900 A | * | 9/1999 | Derbyshire et al. ......... 600/410 |

OTHER PUBLICATIONS

Peshkovsky A., Knuth K.H., Helpern J.A. Motion Correction in MRI Using an Apparatus for Dynamic Angular Position Tracking (ADAPT). Magnetic Resonance in Medicine 2003; 49:138–143.

* cited by examiner

*Primary Examiner*—Shawna J. Shaw
(74) *Attorney, Agent, or Firm*—Morgan & Finnegan, LLP

(57) ABSTRACT

A magnetic resonance imaging ("MRI") system and method of correcting for the motion of a subject during an MRI scan. The motion of a subject in an MRI scan is corrected by acquiring nuclear magnetic resonance ("NMR") spectra of an ordered material attached to a subject, wherein there is a dependence on the NMR spectra of the ordered material's orientation in a magnetic field, and determining an orientation of the subject. Correction information is then supplied to a primary spectrometer channel which is used to execute an MRI scan, and an imaging pulse sequence of the MRI scan is adjusted to correct the subject's orientation.

42 Claims, 8 Drawing Sheets

APPARATUS FOR DYNAMIC ANGULAR POSITION TRACKING

FIELD OF THE INVENTION

The present invention relates generally to magnetic resonance imaging ("MRI"), and more particularly to a system and method of dynamic angular position tracking during MRI scans.

BACKGROUND OF THE INVENTION

Motion during magnetic resonance imaging ("MRI") scans is problematic, frequently prohibitively, in many types of studies. It often leads to artifacts, such as ghosting, which can severely degrade image quality. In studies where repeated scans at the same location need to be acquired, such as in functional MRI experiments, it is crucial that the scanning region within the subject be reliably maintained, requiring that motion be prevented or compensated for, otherwise incorrect interpretation of the results may occur. Further, in imaging of the flexing joints, it is also important to acquire images from the same anatomic location and orientation, which requires dynamic tracking of the scanned region.

In a prior motion correction technique, motion occurring within the scanned plane is corrected during the post-processing of the data. In another motion correction technique, data can be acquired in such a way that in-plane motion is compensated for. However, when through-plane motion takes place, images cannot be repaired retrospectively, because the data is erroneously obtained from an incorrect anatomic location in the subject. In addition, the use of restraining devices to immobilize patients for a significant period of time, to prevent erroneous data acquisition, has proven very uncomfortable.

In another prior motion correction technique, a magnetic resonance-based method for motion tracking is employed. In this method three liquid markers, each in its own transmit/receive coil, are placed on a subject's head during an MRI scan and the magnetic resonance frequencies for the samples are determined in the sequential presence of three magnetic field gradients that span Cartesian space. Because resonance frequency in the presence of a gradient can be correlated with a coordinate along the gradient direction, the positions for each marker can be determined and the orientation of the subject's head can be inferred therefrom. Thus, motion is traced by updating the markers' positions, followed by the determination of the rigid body transformation with respect to the initial coordinates.

In an alternative known motion correction technique, orbital navigator echoes with circular k-space trajectories can also be used to prospectively determine and adjust for translational motion (from the phase differences between the current echo and the reference echo) and rotational motion (from the shift in the magnitude profile of the current echo compared to the reference echo).

Another motion correction technique employs scanning plane adjustments to prospectively compensate for slow translational and rotational motion (position updating is performed every few seconds).

The aforementioned prospective motion correction techniques cannot be used in the background during the MRI scans. Rather, they can only be used in the time periods between MRI scans, because they rely on the use of magnetic field gradients and the same excitation frequency as the MRI scans. Therefore, motion that occurs during the MRI scans cannot be corrected, and additional time is required in between the scans for motion compensation steps.

Another known prior technique employs a laser position detection method to correct for head motion during MRI scans. In this method, motion is optically detected, and real-time feedback is possible by way of supplying six rigid-body motion parameters to a pulse program for compensatory gradient adjustments. This method can be run in the background of the MRI scans. However, a direct line of sight between three retroreflectors attached to a patient's head and the position-sensitive detectors outside of the magnet is necessary. In addition, the equipment required is complicated and expensive.

Thus, there is a need for a system and method capable of correcting for the motion of a subject during an MRI scan, independently of magnetic field gradients, which requires little additional hardware and is run in the background of an MRI scan.

SUMMARY OF THE INVENTION

The present invention overcomes the foregoing and other problems encountered in known teachings by providing a system and method of dynamic angular position tracking during magnetic resonance imaging ("MRI") scans. Advantageously, the system operates independently of magnetic field gradients, which in combination with running spectroscopic measurements at a separate resonance frequency, makes it possible to track a subject's orientation in the background of MRI scans. Further, because the system utilizes hardware available on many spectrometers, which can be used in parallel with MRI scans, the system and method is very cost and time efficient. In addition, the system and method is very fast and sensitive.

In one embodiment of the system and method of the present invention, the motion of a subject during an MRI scan is corrected by acquiring nuclear magnetic resonance ("NMR") spectra of an ordered material attached to a subject, wherein there is a dependence on the NMR spectra of the ordered material's orientation in a magnetic field, and determining an orientation of the subject.

In another embodiment of the system and method of the present invention, an MRI apparatus to correct for the motion of a subject during an MRI scan, includes a computer programmed from a computer readable medium to acquire an NMR spectra of an ordered material attached to a subject, wherein there is a dependence on the NMR spectra of the ordered material's orientation in a magnetic field. The computer is additionally programmed to determine an orientation of the subject. The computer is further programmed to supply correction information to a primary spectrometer channel, which is used to execute an MRI scan, based on the determined orientation of the subject, to adjust at least one MRI scan parameter. The computer is additionally programmed to adjust an imaging pulse sequence of the MRI scan based on the correction information, to correct for the subject's orientation.

In a further embodiment of the system and method of the present invention, the initial orientation of an ordered material in a magnetic field is determined by varying an ordered material's orientation in an MRI scanner's magnetic field, such that its splitting maxima or shifting maxima are located, in order to find the ordered material's principal axes. Then the ordered material is positioned and sealed (in its initial orientation) in a solenoid coil included in an RF transmit/receive circuit. Subsequently, NMR spectra of the ordered material are acquired at a range of angles and the acquired spectra are organized into calibration tables.

The above advantages and features are of representative embodiments only, and are presented only to assist in understanding the invention. It should be understood that they are not to be considered limitations on the invention as defined by the claims, or limitations on equivalents to the claims. For instance, some of these advantages may seem mutually contradictory, in that they cannot be simultaneously implemented in a single embodiment. Similarly, some advantages are primarily applicable to one aspect of the invention. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The accompanying drawings illustrate certain embodiments of the invention.

DETAILED DESCRIPTION

The present invention includes a method and system of dynamic angular position tracking during MRI scans for use with an MRI system, or any similar or equivalent system for obtaining magnetic resonance images.

Figure 1:
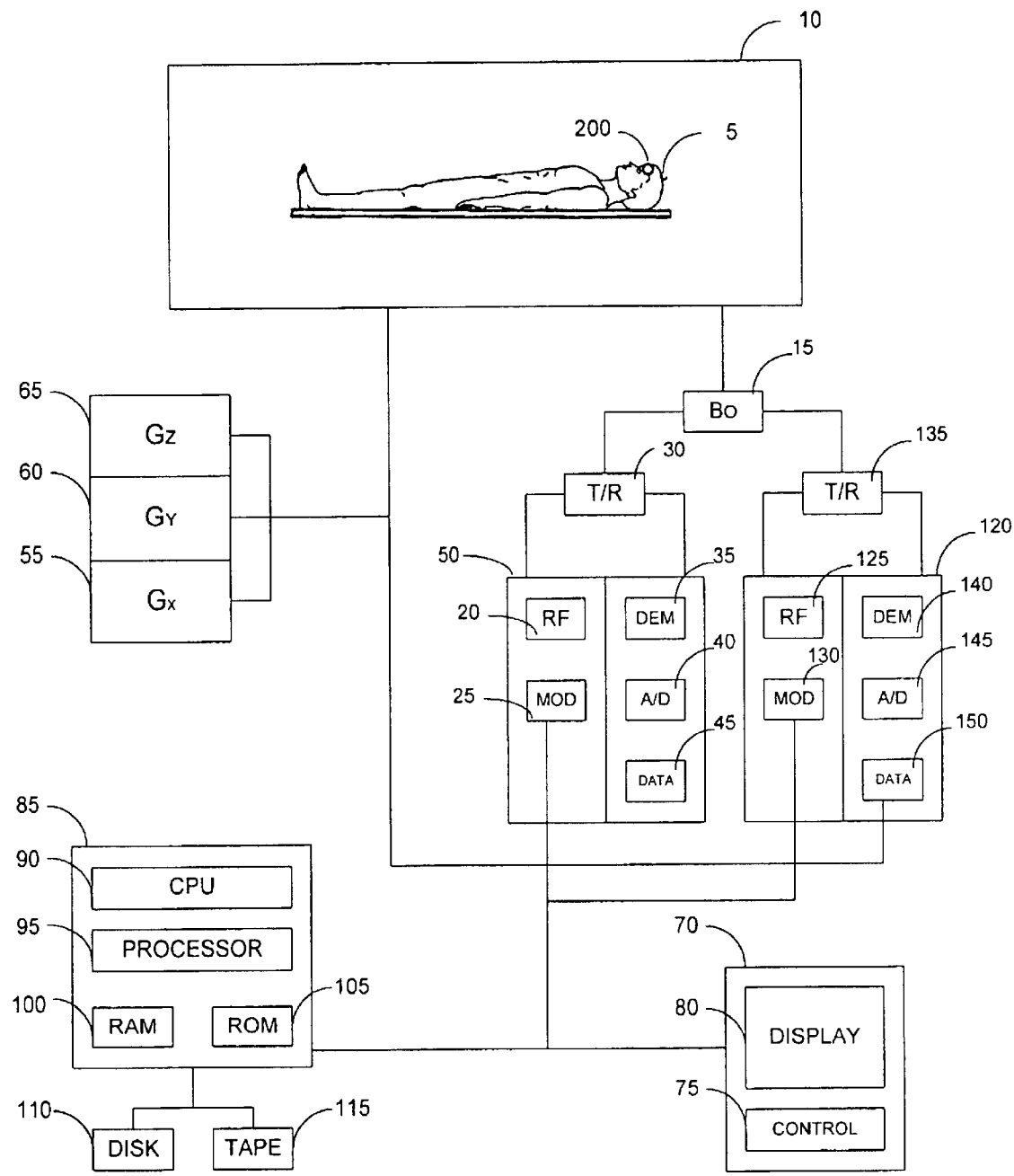
FIG. 1 is a block a diagram of a magnetic resonance imaging ("MRI") system used in accordance with the present invention.

FIG. 1 illustrates an embodiment of a magnetic resonance imaging ("MRI") system in accordance with the present invention. In particular, FIG. 1 shows an MRI system that is capable of receiving a patient or subject 5. The patient 5 has a radio frequency ("RF") transmit/receive circuit 200 attached to its head. The MRI system is a standard system, which includes magnet 10 for generating a large static magnetic field. The magnet 10 is sufficiently large to have a bore into which a patient 5 can fit. The MRI system also includes a magnetic field generator ("$B_0$") 15. A primary spectrometer channel 50 includes a set of modules connected to each other by a backplane including: a radio frequency ("RF") generator 20, a modulator 25, a transmit/receive ("T/R") switch 30, a demodulator 35, an analog-to-digital processing unit 40, and a data display 45. The data display 45 can be located near the magnet 10 so that it is available to a physician attending the patient 5 of an MRI scan.

A secondary spectrometer channel 120 may include another set of modules connected to each other by a backplane such as an RF generator 125, a modulator 130, a T/R switch 135, a demodulator 140, an analog-to-digital processing unit 145, and a data display 150. The data display 150 again can also be located near the magnet 10 so that it is available to a physician attending the patient 5 of an MRI scan. Data display 150 or data display 45 may also be shared between the first and secondary spectrometer channels 50 and 120, respectively.

In FIG. 1, for example, $B_0$ 15 generates a magnetic field. The primary spectrometer channel 50 utilizing RF generator 20 generates RF pulses, and the RF pulses are shaped using modulator 25. The shape of a modulated pulse could be any predetermined shape, and for example may be Guassian of Sinc (i.e., sin(bt)/bt, where b is a constant, and t is time).

Shaped pulses are usually employed in order to shape and limit the bandwidth of the pulse, thereby restricting excitation by the RF pulse to spins that have Larmor frequencies within the RF pulse bandwidth. An RF pulse signal can be transmitted, for example with reference to FIGS. 2A and 2B, to an RF transmit/receive circuit 200, which includes a solenoid coil 220 and an ordered material 215, inter alia, in the magnet assembly 10. If the solenoid coil 220 is pulsed, the secondary spectrometer 120 can acquire a nuclear magnetic resonance ("NMR") spectra of the ordered material 215. The acquired spectra of the ordered material 215 can be utilized to determine the orientation of the ordered material 215 and thus, the patient 5. This process will be discussed in more detail infra.

Gradient generators 55, 60, and 65, which include respective gradient coils (not shown), produce the $G_x$, $G_y$, and $G_z$ magnetic fields in the direction of the polarizing magnetic field generated by $B_0$ 15, with gradients directed in the x, y, and z directions, respectively. The use of the $G_x$, $G_y$, and $G_z$ magnetic field gradients is well known in the art, including such uses as dephasing or rephasing excited spins, spatial phase encoding or spatial gradient encoding of acquired signals, and spatial encoding of the Larmor frequency of nuclei for slice selection.

Induced NMR signals can be detected by receiver coils in the magnet 10 (not shown). The receiver coils and transmitter coils may be the same, with T/R switches 30 or 135 being used to select transmission or reception of radio frequency signals to or from the coils, respectively. The received signal is demodulated by demodulators 35 or 140, and the demodulated signal is amplified and processed in the analog-to-digital processing units 40 or 145 to provide data as indicated at 45 or 150.

The operation of the system can be controlled from an operator's console 70, which includes a keyboard and control panel 75 and a display 80. The operator's console 70 can communicate with a separate computer system 85 that enables an operator to control the production and display of images on the display 80. The computer system 85 includes a number of modules, which communicate to each other through a backplane. These include a central processing unit ("CPU") 90, a processor 95, a random access memory ("RAM") 100, and a read-only memory ("ROM") 105. The computer system 85 is linked to a disk storage 110 and a tape drive 115 for storing image data and programs. The computer system 85 can monitor and control the whole process according to the functional block diagram of FIG. 1. The computer system 85 can also include additional components found in known commercial or experimental systems that are used to control and monitor the entire process such as, for example, components necessary to control the timing, amplitudes, and shapes of the control signals for the various elements of the MRI system.

Figure 2A:
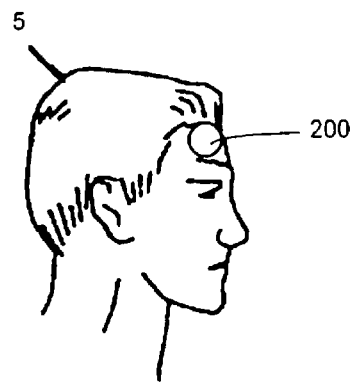
FIG. 2A illustrates an embodiment of a radio frequency ("RF") transmit/receive circuit in accordance with the present invention.
Figure 2B:
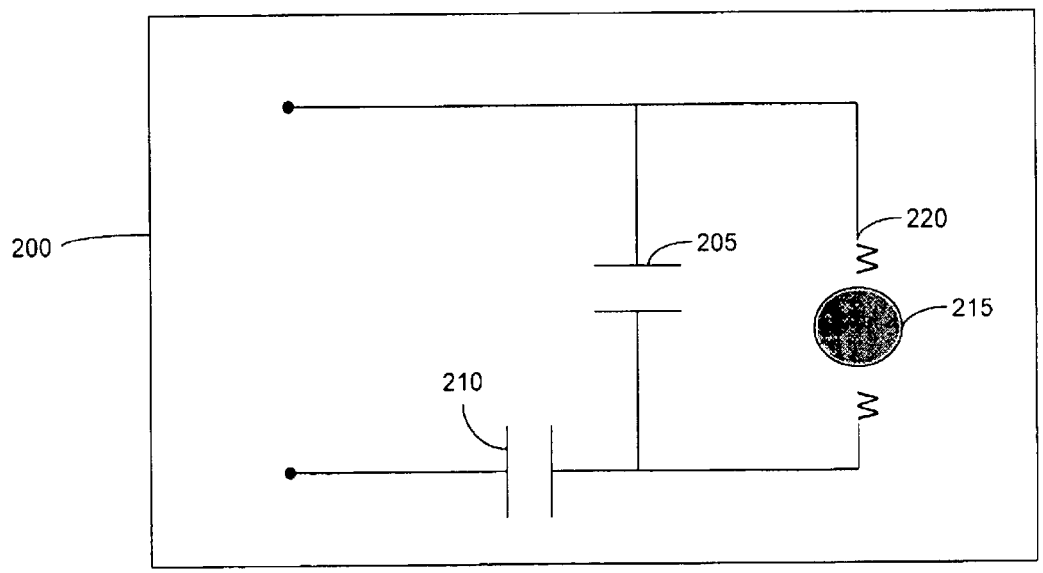
FIG. 2B illustrates an embodiment of a radio frequency ("RF") transmit/receive circuit in accordance with the present invention.

FIGS. 2A and 2B illustrate an embodiment of an RF transmit/receive circuit 200 in accordance with the present invention. As shown in FIG. 1 the patient 5 will have an RF transmit/receive circuit 200 associated with their head. The RF transmit/receive circuit 200 described in this embodiment can be constructed by utilizing a standard tuned RF transmit/receive circuit with a tuning capacitor 205 in parallel and matching capacitor 210 in series with a solenoid coil 220 tuned for detecting magnetic resonance signals. The RF transmit/receive circuit 200 can be associated with or attached to the head of the patient 5 in a variety of manners. For example, the RF transmit/receive circuit 200 can be attached to an elastic headband, cap, frame, or the like, which can be placed on the patient's 5 head. Further, fiducial scanning markers including the RF transmit/receive circuit 200 can be attached to the patient's 5 head in a variety of manners. Thus, for example, fiducial scanning markers can be attached to a patient's 5 head by using an attachable frame or attaching the markers to the skin with an adhesive.

The RF transmit/receive circuit 200 also includes an ordered material 215, such as a single crystal, oriented polymer, liquid crystal or the like. The ordered material 215 employed is subject to quadrupolar interactions such that there is a dependence on the NMR spectra of the ordered material's orientation in a magnetic field. Ordered material or materials that have a dependence of quadrupolar coupling, chemical shift (chemical shift anisotropy), dipolar coupling, or any interaction on their orientation in a magnetic field, may also be used in the present invention.

The following example is presented to illustrate features and characteristics of the present invention, and is provided solely to assist in explanation of an exemplary implementation of the invention and is not intended to be construed as being limited thereto.

This illustrative example employs deuterium magnetic resonance spectroscopy. It should be noted that, when employing deuterium magnetic resonance spectroscopy, deuterium's low resonance frequency allows simultaneous independent monitoring while using a separate spectrometer channel of the scanner, such as secondary spectrometer channel 120, throughout an MRI scan. Further, in the case of a single crystal of deuterated barium chlorate monohydrate $Ba(ClO_3)_2{*}D_2O$, there is an average of over 6 kilohertz per degree change in splitting of the deuterium resonance peaks. Thus, rotations by a fraction of a degree can easily be spectroscopically observed. In addition, deuterium magnetic resonance spectroscopy utilizes the anisotropic interaction between deuterium nuclei and their environment (deuterium quadrupolar interaction in a single crystal of $Ba(ClO_3)_2{*}D_2O$) to monitor a patient's 5 orientation in a magnetic field. This is possible because there is a mathematical relationship between the peak splittings in the NMR spectra of the single crystal of $Ba(ClO_3)_2{*}D_2O$, hereinafter called "the crystal", and the crystal's orientation in the magnetic field. The rotations of the crystal lead to changes in the peak splittings that can be observed in the deuterium spectra. Thus, the present invention can be used to track two out of three angles of rotation: namely pitch and yaw. Roll (the "no" motion) cannot be detected due to the cylindrical symmetry of the magnetic field in an MRI system. The "no" motion is, however, the least significant of the three, because for a large number of applications such as brain imaging, this is an in-plane motion which is the easiest to restrict and correct.

The following discussion regarding quadrupolar coupling is provided to elucidate the mathematical relationship between the peak splittings in the NMR spectra of a crystal and the crystal's orientation in a magnetic field.

Quadrupolar Coupling

For nuclei with spin I=1 in a high magnetic field approximation the quadrupolar interaction Hamiltonian can be expressed as:

$$H_Q = \frac{e^2 Qq}{8I(2I-1)\hbar}\left[3\cos^2\alpha - 1 - \eta\sin^2\alpha\cos(2\beta)\right]\left[3I_z^2 - I(I+1)\right] \quad (1)$$

where Q is the quadrupolar moment of the nucleus, $I_z$ is the component of I along the laboratory z-axis, $$\delta = \frac{3}{4}\frac{e^2 Qq}{\hbar}$$

(in the I=1 case) is the quadrupolar coupling constant, which characterizes the strength of the quadrupolar coupling and is related to the z'z' component of the quadrupolar interaction tensor in its diagonal form (in the principal axes frame ("PAS")), and η is the asymmetry parameter, which is related to the difference between the y'y' and the x'x' components of the tensor in PAS. Polar angles α and β define the latitudinal and longitudinal orientation respectively of the spectrometer's magnetic field $B_0$ in the PAS. The peak splittings in the NMR spectra due to the influence of this perturbation term on the Zeeman Hamiltonian are (in Hz):

$$\Delta\nu = \frac{\delta}{2\pi}\left(3\cos^2\alpha - 1 - \eta\sin^2\alpha\cos(2\beta)\right) \quad (2)$$

The following is a discussion of deuterium quadrupolar coupling in $Ba(ClO_3)_2{*}D_2O$.

Deuterium Quadrupolar Coupling in $Ba(ClO_3)_2{*}D_2O$

Figure 3:
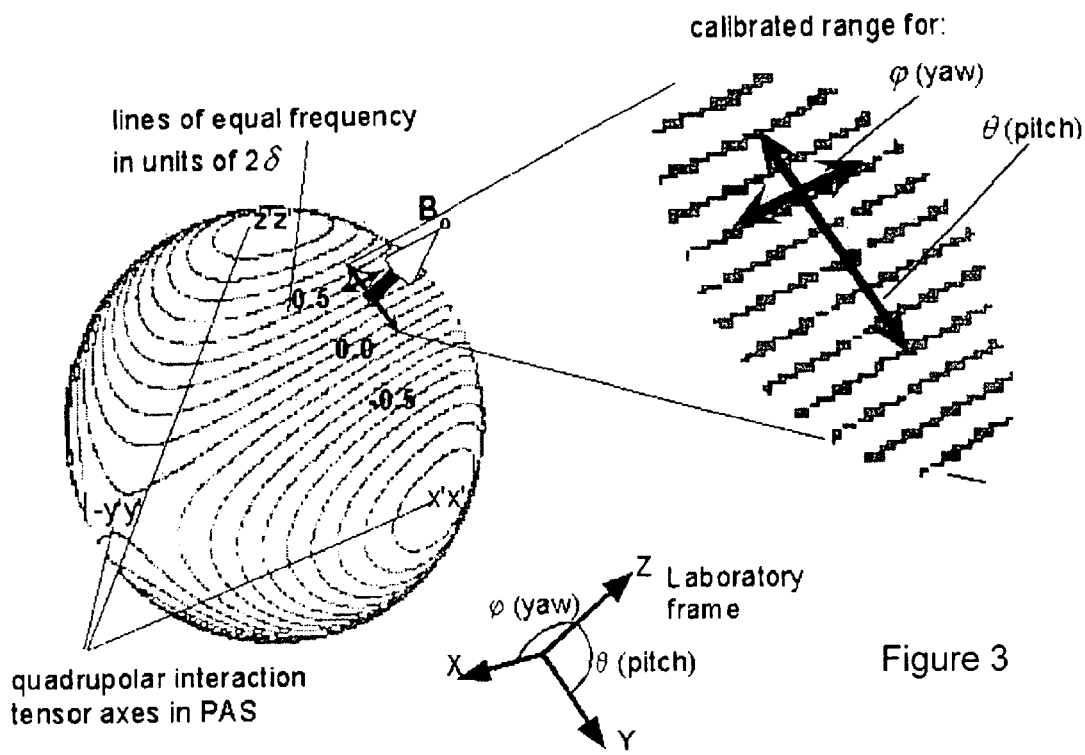
FIG. 3 illustrates the dependence of peak splittings in the deuterium spectra of a single crystal of $Ba(ClO_3)_2 * D_2O$ on the crystal's orientation in the scanner's magnetic field.

The deuterium quadrupolar constant in $Ba(ClO_3)_2{*}D_2O$ at 20° C. is 91.1 kHz and the asymmetry parameter is 0.976. Therefore, according to expression 2, the maximum possible peak splitting in the deuterium spectrum, which occurs when the angle α=0° ($B_0$ is aligned with z' axis in PAS), is 182.2 kHz. The second largest in absolute value splitting occurs at the angles α=90° and β=0°. This splitting is −180 kHz. The minus sign makes the peaks switch positions, which does not affect the appearance of the spectrum. FIG. 3 is a mathematical model in which lines of equal splitting frequency on a unit sphere are displayed in order to help visualize the dependence of the peak splittings in the deuterium spectra of a single crystal of $Ba(ClO_3)_2{*}D_2O$ on the crystal's orientation in the scanner's magnetic field $B_0$. Points on the surface sphere represent a direction of $B_0$ in PAS. The $B_0$ vector is shown with the crystal in its initial orientation. Crossed arrows correspond to the set of angles for which calibration measurements were taken. These measurements will be discussed later in reference to FIGS. 7–10. The expanded region makes it easier to see why strong dependence of the peak splittings of the angle $\theta$ (pitch) can be expected (the lines are crossed as the angle changes), while the dependence on the angle $\Phi$ (yaw) is insignificant ($B_0$ moves along the lines). The intersection of the lines with the $B_0$ vector determines the splittings in units of $2\delta$. For example, if the initial orientation of the crystal is chosen as shown in FIG. 3, then varying the pitch angle $\theta$ will lead to very large changes in the peak splittings, while rotations by the yaw angle $\Phi$ will not have much of an effect. This feature can be used to track the angle $\theta$ separately from $\Phi$. In addition, the initial orientation can also be chosen such that observation of the angle $\Phi$ separately from $\theta$ is possible.

Figure 4:
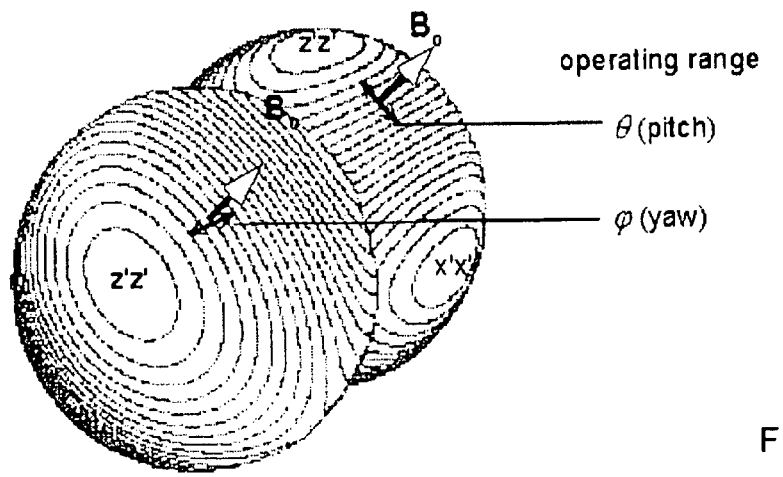
FIG. 4 illustrates an arrangement of two single crystals, in which two angles can be tracked simultaneously and independently.

FIG. 4 is a mathematical model which illustrates an arrangement of two single crystals, in which both angles $\theta$ and $\Phi$ can be tracked simultaneously and independently. For the left most single crystal, the lines of equal frequency will be crossed (leading to changes in the peak splittings) when the angle $\Phi$ is changed, the angle $\theta$ having no effect, and for the right most single crystal, the angle $\theta$ affects the splittings, while $\Phi$ does not. Thus, both angles $\theta$ and $\Phi$ can be tracked simultaneously and independently of each other.

Figure 5:
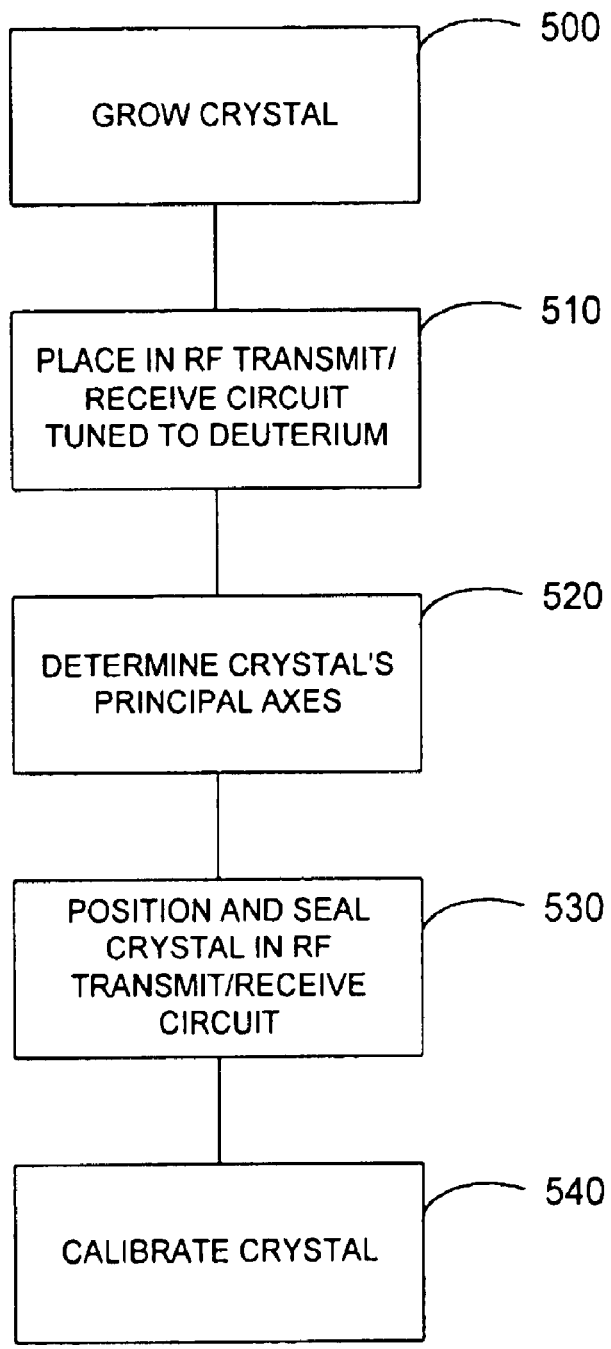
FIG. 5 is an illustrative flow chart describing the method of the present invention including determining the initial orientation of an ordered material in a magnetic field using a single crystal of $Ba(ClO_3)_2 * D_2O$ as an example.

FIG. 5 is an illustrative flow chart describing the method of the present invention including determining the initial orientation of an ordered material in a magnetic field using a single crystal of $Ba(ClO_3)_2 \ast D_2O$ as an example. An ordered material 215 of $Ba(ClO_3)_2 \ast D_2O$, hereinafter referred to as "the crystal," is grown by slow evaporation of the saturated solution of $Ba(ClO_3)_2$ in $D_2O$ (step 500). The crystal is monoclinic and the positions of the deuterons are related by $C_2$ symmetry about the axis through the oxygen atom. At room temperature, the deuterons rapidly flip, thereby leading to the existence of one quadrupolar coupling tensor, rather than two (one for each deuteron). Thus, a single peak splitting occurs. This rapid flipping (on a microsecond time scale) also accounts for the generation of local fluctuating magnetic fields in the molecules leading to efficient deuteron spin-lattice relaxation ($T_1$ typically is on the order of a few milliseconds. Because of these characteristics of the crystal, the angular dependence of the splittings is rudimentary, and rapid updating of the angular position information is possible.

After the crystal has been grown, the crystal is placed in the solenoid coil 220 of an RF transmit/receive circuit 200 tuned to deuterium frequency (step 510). Subsequently, the crystal's principal axes are determined by varying the crystal's orientation such that its observed splittings are maximized (step 520). For ordered material or materials 215 that exhibit chemical shift anisotropy, in step 520, the shifting maxima of the ordered material is located. Next, the crystal is positioned and sealed in its initial orientation in the solenoid coil 220 included in the RF transmit/receive circuit 200 (step 530). The crystal can be sealed with an adhesive, such as an epoxy, glue or the like. The crystal is then calibrated by observing the dependence of its peak splittings in the deuterium NMR spectra on the crystal's angular position (step 540). While calibrating the crystal, in step 540, the NMR spectra of the crystal are acquired at a range of angles. The NMR spectra acquired are then organized into calibration tables, which can be stored, for example, in the computer system's 85 memory.

The aforementioned procedure was demonstrated experimentally by constructing a phantom capable of rotating in two dimensions. With this phantom, the rotation of an RF transmit/receive circuit by the angle $\theta$ (pitch) about the horizontal laboratory axis could be executed externally, and the angle $\Phi$ (yaw) about the vertical laboratory axis was set prior to the insertion into the magnet. The phantom consisted of a cogwheel, vertically mounted in such a way, that it could be precisely rotated by a cog-rod, which came out of the magnet. The cogwheel had another smaller wheel mounted to it perpendicularly, which could be manually rotated. This wheel had the RF transmit/receive circuit including the crystal in a solenoid coil attached to it. For each calibration measurement step, the angle $\Phi$ of the crystal's angular position was set while the assembly was outside of the magnet, after which the phantom was inserted into the magnet and the angle $\theta$ was varied by pulling or pushing the cog-rod.

The following experiments were performed on a standard Marconi 3 Tesla 80 cm bore MRI system. In these experiments, the orientations of the principal axes of the deuterium quadrupolar interaction tensor in the crystal of $Ba(ClO_3)_2 \ast D_2O$ were determined by varying the crystal's orientation, such that the observed splittings were maximized. After this, the coil and the crystal were sealed in epoxy, such that when the assembly was placed in the phantom, both $\theta$ and $\Phi$ were at zero and the tensor axes were oriented in the way illustrated in FIG. 3. In this orientation the relationship between the polar angle $\alpha$ from expression 2 and the pitch angle $\theta$ set by the rotating phantom is very simple:

$$\alpha = \theta + 35° \quad (3)$$

The relationship between the angle $\beta$ from expression 2 and the yaw angle $\Phi$ set by the rotating phantom is more complex, however, they reach zero simultaneously.

Figure 7:
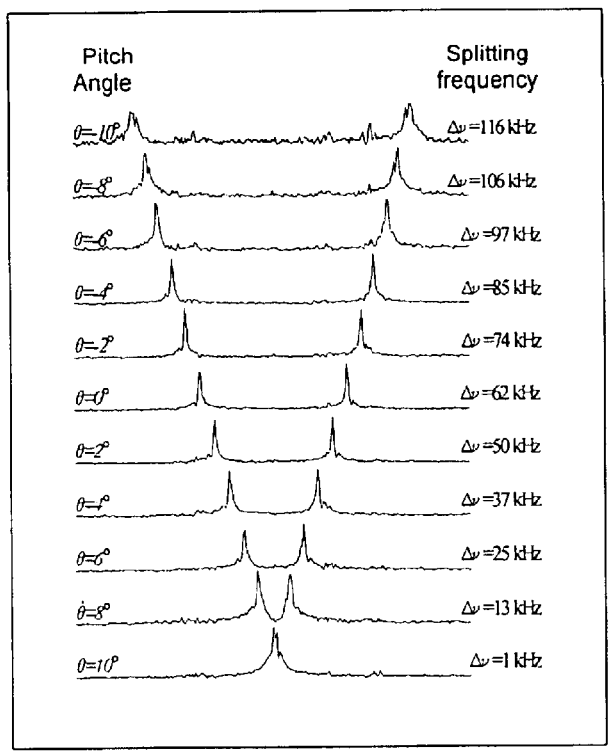
FIG. 7 illustrates the deuterium spectra of a single crystal of $Ba(ClO_3)_2 * D_2O$ as a result of rotation of the crystal about the horizontal axis by a range of pitch angles $\theta$.
Figure 8:
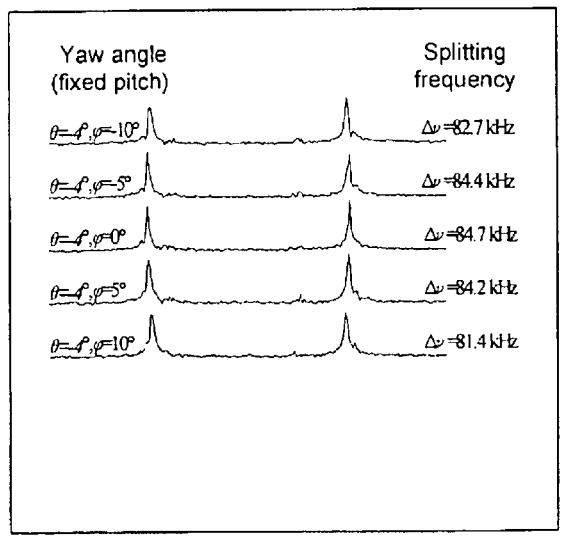
FIG. 8 illustrates the deuterium spectra of a single crystal of $Ba(ClO_3)_2 * D_2O$ as a result of rotation of the crystal about the vertical axis by a range of yaw angles $\Phi$.
Figures 9, 10:
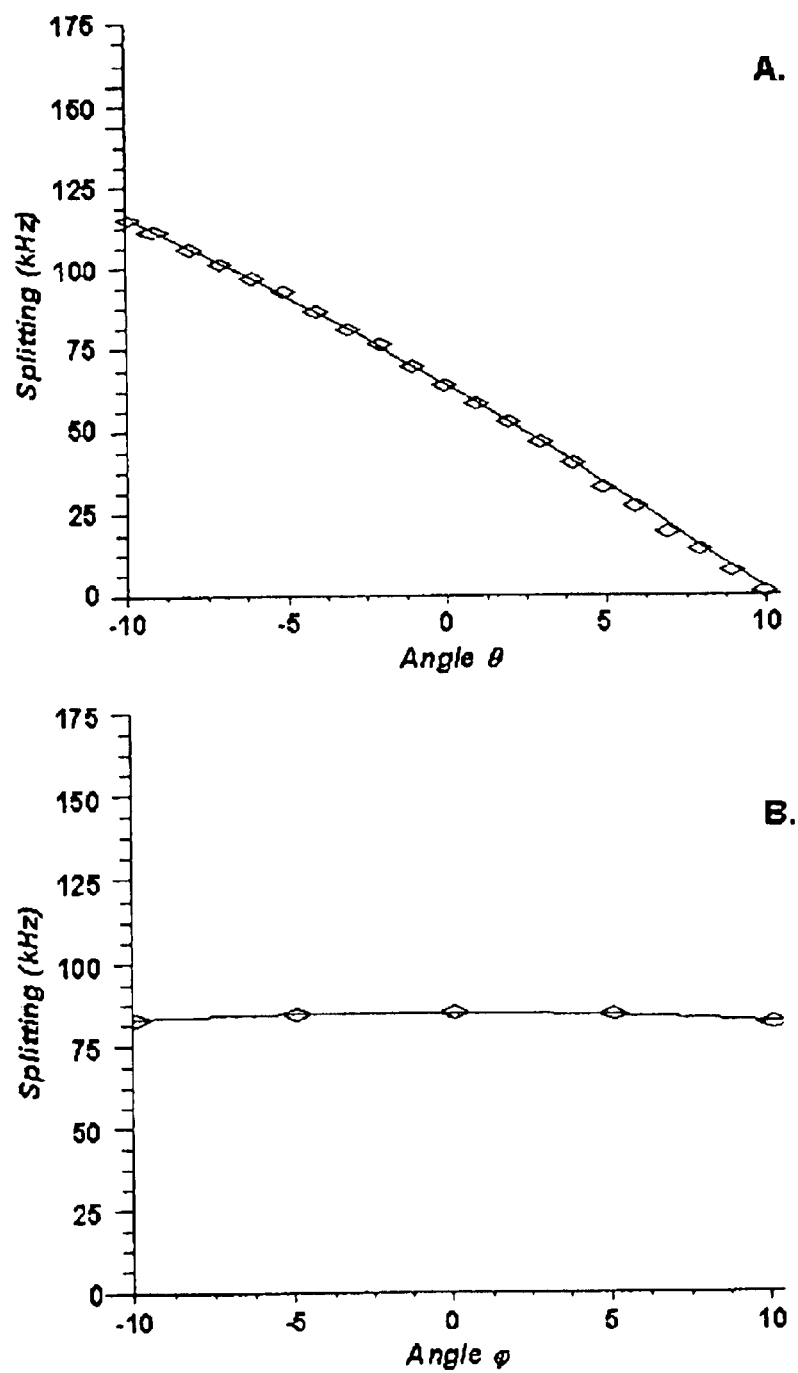
FIG. 9 illustrates the data presented in FIG. 7 as a plot of the dependence of the quadrupolar splitting in a single crystal of $Ba(ClO_3)_2 * D_2O$ on the angle $\theta$ (pitch)
FIG. 10 illustrates the data presented in FIG. 8 as a plot of the splittings as a function of $\Phi$ (yaw) with $\theta$ (pitch) at −4°.

Two sets of spectra were then acquired. The first set consisted of spectra recorded at the angle $\Phi$ kept at zero degrees and the angle $\theta$ varied in one-degree increments between −10 and 10 degrees. FIG. 7 illustrates the deuterium spectra of the single crystal of $Ba(ClO_3)_2 \ast D_2O$ as a result of rotation of the crystal about the horizontal axis by the angles $\theta$ (pitch). In FIG. 7 the crystal was rotated by 2° between each consecutive spectrum acquisition. The excitation frequency was 19.6176 MHz and a 1-pulse-acquire sequence was used with 10 microsecond long 90° pulses (excitation bandwidth of 100 kHz). The acquisition time for each spectrum was 1 second due to signal averaging, which was used to increase signal to noise ratio for presentation purposes. For practical use, however, much lower levels of signal to noise are sufficient, and the acquisition of the angular parameters can be performed significantly faster (by about two orders of magnitude). The second set was a series of spectra acquired at the angle $\theta=-4°$ and the angle $\Phi$ varied between −10 and 10 degrees in 5-degree increments. This set is illustrated in FIG. 8. FIG. 8 illustrates the deuterium spectra of the single crystal of $Ba(ClO_3)_2 \ast D_2O$ positioned at the pitch angle $\theta=-4°$ and rotated about the vertical axis by the angles $\Phi$ (yaw). A 1-pulse acquire sequence with an excitation frequency of 19.6176 MHz was used with a 10 µs long 90° pulses (excitation bandwidth of 100 kHz). When the crystal is initially positioned as described above, the dependence of the peak splittings on the rotations about the vertical axis by $\Phi$ (yaw) is significantly lower than on the rotations about the horizontal axis by $\theta$ (pitch). The dependence is at a minimum when $\theta=10°$, but even at $\theta=-4°$ there is almost no change in the splitting in the 10° range for the angle Φ versus changes of about 60 kHz over the same range of the angle θ, as shown in FIG. 7. Using this system for the measurements of the angle θ is reliable because no significant error is introduced by other rotations (rotations about the z-axis (roll) do not affect the measurements because they do not change the quadrupolar couplings and, therefore, do not alter the peak splittings). Subsequently, the data was organized in calibration tables, from which curves of the angular dependence of the splittings were created, as illustrated in FIGS. 9 and 10. For example, in FIG. 9, the data presented in FIG. 7 is illustrated as a plot of the dependence of the quadrupolar splitting in the crystal of $Ba(ClO_3)_2*D_2O$ on the angle θ (pitch). The angle Φ (yaw) was kept at 0°. Further, in FIG. 10, splitting as a function of Φ (yaw) with θ (pitch) at −4° was plotted to supplement FIG. 8. It is evident from FIGS. 7–10 that while a very strong dependence of the splittings on the angle θ exists (over six kilohertz per degree), changes in the angle Φ do not affect the spectra significantly. In addition, at θ=−4° the dependence of the splittings on the angle Φ, although small, is still not at its minimum.

Figure 6:
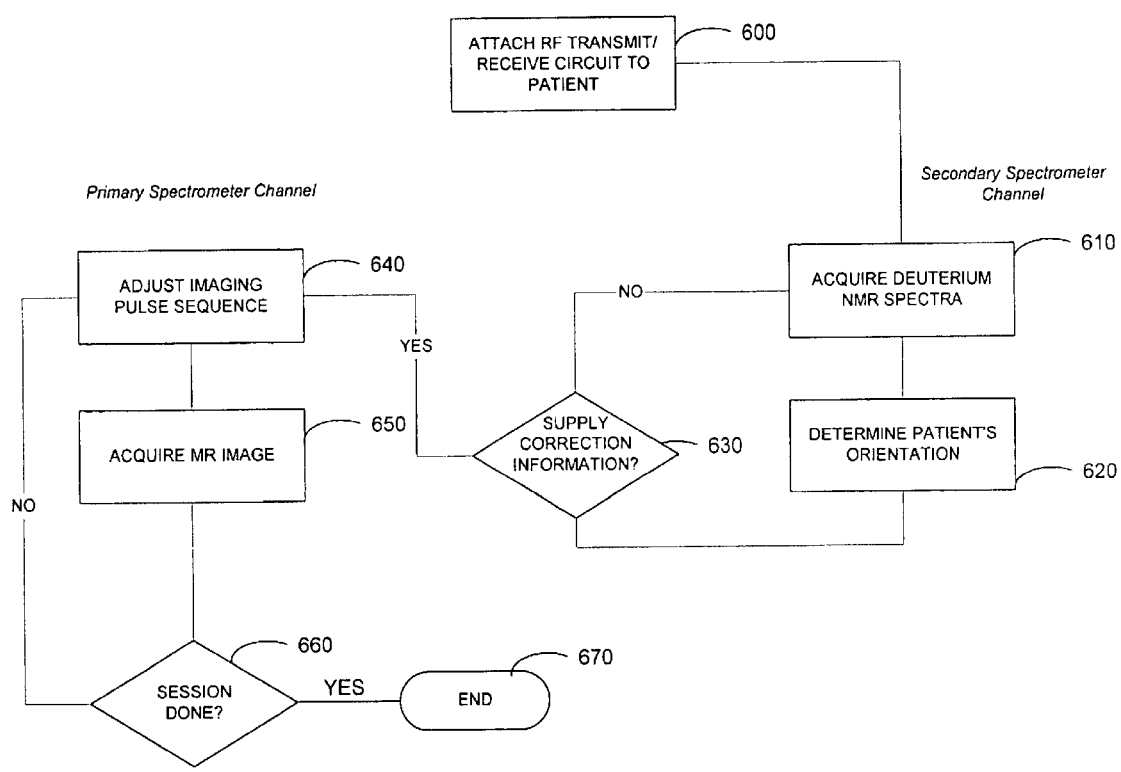
FIG. 6 is an illustrative flow chart describing the method of the present invention including the tracking and correcting of a patient's orientation in accordance with the present invention.

FIG. 6 is an illustrative flow chart describing the method of the present invention including the tracking and correcting of a patient's 5 orientation in accordance with the present invention. In the arrangement of FIG. 1 or 2, an RF transmit/receive circuit 200 is attached to a patient's 5 head (step 600) either before or after entry into an MRI system. As an MRI scan is being executed, the deuterium NMR spectra of the crystal attached to the patient 5 is acquired via a secondary spectrometer channel 120 of the MRI system that operates at a separate frequency from the primary spectrometer channel 50 executing the MRI scan (step 610).

After the deuterium NMR spectra of the crystal has been acquired, the orientation of the patient 5 is determined (step 620). This is accomplished by correlating changes in the peak splittings in the NMR spectra of the crystal with changes in the patient's 5 orientation. If an ordered material 215 which exhibits chemical shift anisotropy is utilized, the orientation of the patient 5 would be determined by correlating changes in the peak shiftings in the NMR spectra of the crystal with changes in the patient's 5 orientation. Both processes are effectuated in this embodiment by accessing the calibration tables stored on the computer system's memory pertaining to the particular crystal or ordered material 215 used. Steps 610 and 620 can be constantly run in the background of the MRI scan. The orientation of the patient 5 is corrected by supplying correction information to a primary spectrometer channel 50, which is used to execute an MRI scan, based on the determined orientation of the patient 5 to adjust at least one scan parameter if motion has occurred (step 630). The orientation information is typically supplied to the primary spectrometer channel 50 of the MRI system at the request of an MRI system operator. However, in an alternative embodiment a software program can be employed, which supplies determined orientation information when there is patient 5 movement. Alternative software programs can also be employed which forward the determined orientation at random or fixed intervals.

Once the correction information is supplied to the primary spectrometer channel 50 the image pulse sequence of the MRI scan can be adjusted based on the correction information supplied, to correct the patient's orientation (step 640). Again, this adjustment can be controlled by an operator of the MRI system or by software programmed to adjust the image pulse sequence. The MRI pulse sequence software found in the primary spectrometer channel 50 of the MRI system, may be used to modify gradient orientations, receiver frequency, transmitter frequencies, and transmitter pulse phases, to make the appropriate adjustments to correct the position and orientation of the viewing plane based on the correction information supplied. Once the imaging pulse sequence is adjusted, in step 640, an MR image may also be acquired (step 650). If the scanning/tracking session is complete, for example, at the request of an operator, the system exits (step 670), otherwise, the system loops back (step 640).

Figure 11:
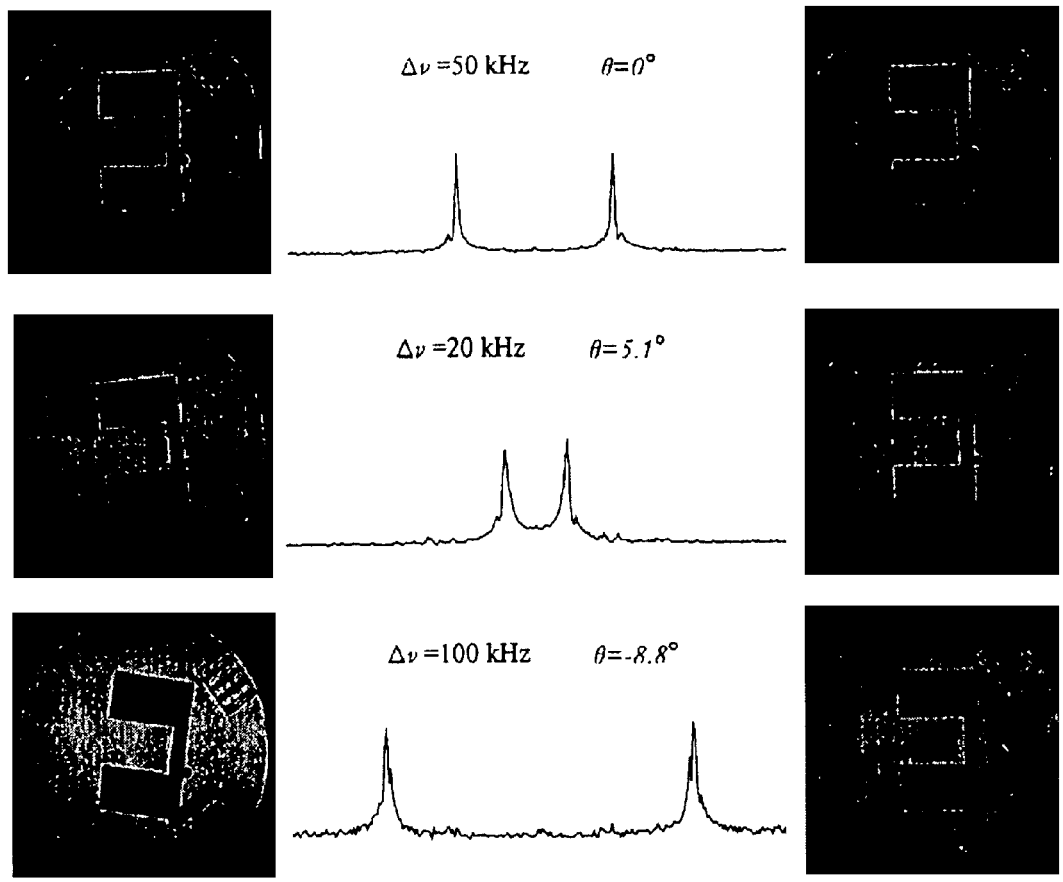
FIG. 11 illustrates motion correction in accordance with the present invention.

FIG. 11 illustrates an experiment using motion correction in accordance with the present invention. The following experiment was performed on a standard Marconi 3 Tesla 80 cm bore MRI system. The left hand column shows three sagittal images of a phantom, to which a crystal of $Ba(ClO_3)_2*D_2O$ in a tuned sample coil was rigidly attached. The original image of the phantom appears at the top left. The second and third images were taken after the phantom was rotated by some unknown angle θ (pitch) with respect to the original image at the top left. The middle column shows deuterium spectra of the crystal at each position of the phantom. The identified angles with respect to the original orientation were inferred from the changes in the peak splittings. The right hand column shows the adjusted images that were acquired after the angles from the corresponding spectra were supplied to the pulse sequence for orientation adjustment. In each case the system successfully compensated for the phantom's rotation.

In an alternative embodiment, two ordered materials could be used to detect changes in the pitch and yaw of a subject. In this embodiment, one ordered material can be oriented to detect changes in θ and the other ordered material can be oriented to detect changes in Φ as shown previously in FIG. 4. For this configuration, the free induction decay signals ("FID") recorded in the secondary spectrometer channel 120 will generally consist of four resonance peaks, one pair of resonances per ordered material. The amplitudes of the resonance peak pair depend on the characteristics of each particular ordered material. Thus, by choosing ordered materials with different resonance amplitudes, it is always clear to which ordered material a given pair of resonance peaks belongs. Given the frequencies of these resonance peaks a maximum likelihood procedure can be used to infer the most probable orientations of the subject. For example, the FID data can be used directly to estimate the orientation by modeling the expected complex FID produced by these two resonance peaks. Thus, by applying a maximum likelihood method, which uses a gradient ascent search, the acquired FID data can be used to rapidly identify the orientation angles.

It should be understood that the above description is only representative of illustrative embodiments. For the convenience of the reader, the above description has focused on a representative sample of possible embodiments, a sample that is illustrative of the principles of the present invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. Other applications and embodiments can be conceived by those without departing from the spirit and scope of the present invention. It is therefore intended, that the invention is not to be limited to the disclosed embodiments but is to be defined in accordance with the claims that follow. It can be appreciated that many of those undescribed embodiments are within the scope of the following claims, and others are equivalent.

What is claimed is:

1. A method of correcting for the motion of a subject during a magnetic resonance imaging ("MRI") scan, comprising:
   acquiring a nuclear magnetic resonance ("NMR") spectra of an ordered material attached to the subject, wherein there is a dependence on the NMR spectra of the ordered material's orientation in a magnetic field;
   determining an orientation of the subject based on the acquired spectra, and
   correcting the MRI scan.

2. The method according to claim 1, further comprising:
   supplying correction information to a primary spectrometer channel, which is used to execute an MRI scan, based on the determined orientation of the subject to adjust at least one MRI scan parameter.

3. The method according to claim 2, further comprising:
   adjusting an imaging pulse sequence of the MRI scan, based on the correction information, to correct for the subject's orientation.

4. The method according to claim 3, wherein the imaging pulse sequence of the MRI scan is adjusted based on a request.

5. The method according to claim 1, wherein the ordered material is a single crystal, oriented polymer, or liquid crystal.

6. The method according to claim 1, further comprising:
   attaching a radio frequency ("RF") transmit/receive circuit to the subject.

7. The method according to claim 6, wherein the ordered material is embedded in a solenoid coil in the RF transmit/receive circuit.

8. The method according to claim 1, wherein the spectra of the ordered material are acquired with an independent spectrometer channel of the MRI system that operates at a separate frequency from the primary spectrometer channel executing the MRI scan.

9. The method according to claim 1, wherein the orientation of the subject is determined by correlating changes in the peak splittings of the NMR spectra of the ordered material with the changes in the subject's orientation.

10. The method according to claim 9, wherein the subject's orientation is determined by accessing calibration tables pertaining to the ordered material.

11. The method according to claim 1, wherein the orientation of the subject is determined by correlating changes in the peak shiftings of the NMR spectra of the ordered material with the changes in the subject's orientation.

12. The method according to claim 11, wherein the subject's orientation is determined by accessing calibration tables pertaining to the ordered material.

13. The method according to claim 1, further comprising:
   recording an image after the imaging pulse sequence is adjusted.

14. The method according to claim 1, wherein two ordered materials are employed.

15. The method according to claim 14, wherein two ordered materials with different resonance amplitudes are employed.

16. The method according to claim 14, wherein at least one ordered material is oriented to detect changes in pitch.

17. The method according to claim 14, wherein at least one ordered material is oriented to detect changes in yaw.

18. A method of correcting for the motion of a subject during an MRI scan, comprising:
   attaching an RF transmit/receive circuit to a subject, wherein the RF transmit/receive circuit includes a pre-calibrated ordered material embedded in a solenoid coil;
   acquiring an NMR spectra of the ordered material, wherein there is a dependence on the NMR spectra of the ordered material's orientation in a magnetic field;
   determining an orientation of the subject by accessing calibration tables pertaining to the ordered material and correlating the NMR spectra of the ordered material with the calibration tables;
   supplying correction information to a primary spectrometer channel, which is used to execute an MRI scan, based on the determined orientation of the subject to adjust at least one MRI scan parameter; and
   adjusting an imaging pulse sequence of the MRI scan, based on the correction information, to correct the subject's orientation.

19. A system of correcting for the motion of a subject during an MRI scan, comprising:
   means for acquiring an NMR spectra of an ordered material attached to the subject, wherein there is a dependence on the NMR spectra of the ordered material's orientation in the magnetic field; and
   means for determining the orientation of the subject based on the acquired spectra.

20. The system according to claim 19, further comprising:
   means for supplying correction information to a primary spectrometer channel, which is used to execute an MRI scan, based on the determined orientation of the subject to adjust at least one MRI scan parameter.

21. The system according to claim 20, further comprising:
   means for adjusting an imaging pulse sequence of the MRI scan, based on the correction information, to correct for the subject's orientation.

22. The system according to claim 21, wherein the imaging pulse sequence of the MRI scan is adjusted based on a request.

23. The system according to claim 19, wherein the ordered material is a single crystal, oriented polymer, or liquid crystal.

24. The system according to claim 19, further comprising:
   means for attaching a radio frequency RF transmit/receive circuit to the subject.

25. The system according to claim 24, wherein the ordered material is embedded in a solenoid coil in the RF transmit/receive circuit.

26. The system according to claim 19, wherein the spectra of the ordered material are acquired with an independent spectrometer channel of the MRI system that operates at a separate frequency from the primary spectrometer channel executing the MRI scan.

27. The method according to claim 19, wherein the orientation of the subject is determined by correlating changes in the peak splittings or peak shiftings of the NMR spectra of the ordered material with the changes in the subject's orientation.

28. The system according to claim 27, wherein the subject's orientation is determined by accessing calibration tables pertaining to the ordered material.

29. The system according to claim 19, further comprising: means for recording an image after the imaging pulse sequence is adjusted.

30. The system according to claim 19, wherein two ordered materials are employed.

31. The system according to claim 30, wherein two ordered materials with different resonance amplitudes are employed.

32. The system according to claim 30, wherein at least one ordered material is oriented to detect changes in pitch.

33. The system according to claim 30, wherein at least one ordered material is oriented to detect changes in yaw.

34. An apparatus for correcting for the motion of a subject during an MRI scan, comprising:
 an MRI apparatus connected to a computer;
 the computer is programmed to:
  acquire an NMR spectra of an ordered material attached to the subject, wherein there is a dependence on the NMR spectra of the ordered material's orientation in a magnetic field; and
  determine an orientation of the subject based on the acquired spectra.

35. The apparatus of claim 34, wherein the computer is further programmed to supply correction information to a primary spectrometer channel, which is used to execute an MRI scan, based on the determined orientation of the subject to adjust at least one MRI scan parameter.

36. The apparatus of claim 34, wherein the computer is further programmed to adjust an imaging pulse sequence of the MRI scan based on the correction information, to correct for the subject's orientation.

37. The apparatus of claim 34, wherein the computer is further programmed to adjust the imaging pulse sequence of the MRI scan based on a user's request.

38. The apparatus of claim 34, wherein the computer is further programmed to acquire the spectra of the ordered material with an independent spectrometer channel of the MRI apparatus that operates independently from the primary spectrometer channel executing the MRI scan.

39. The apparatus of claim 34, wherein the computer is further programmed to determine the orientation of the subject by correlating changes in the peak splittings or peak shiftings of the NMR spectra of the ordered material with changes in the subject's orientation.

40. The apparatus of claim 39, wherein the computer is further programmed to determine the orientation of the subject by accessing pre-determined calibration tables pertaining to the ordered material.

41. The apparatus of claim 34, wherein the computer is further programmed to record an image after the imaging pulse sequence is adjusted.

42. A computer program product comprising a computer readable medium having a program stored thereon and executable by a processor comprising:
 instruction code which, when executed by the processor, acquires an NMR spectra of an ordered material attached to a subject, wherein there is a dependence on the NMR spectra of the ordered material's orientation in a magnetic field;
 instruction code which, when executed by the processor, determines an orientation of the subject based on the acquired spectra;
 instruction code which, when executed by the processor, supplies correction information to a primary spectrometer channel, which is used to execute an MRI scan, based on the determined orientation of the subject to adjust at least one MRI scan parameter; and
 instruction code which, when executed by the processor, adjusts an imaging pulse sequence of an MRI scan, based on the correction information, to correct for the subject's orientation.

* * * * *